(12) United States Patent
Takigawa

(10) Patent No.: US 10,886,111 B2
(45) Date of Patent: *Jan. 5, 2021

(54) PROCESS FOR PRODUCING SPUTTERING TARGET AND SPUTTERING TARGET

(71) Applicant: SUMITOMO CHEMICAL COMPANY, LIMITED, Tokyo (JP)

(72) Inventor: Mikio Takigawa, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 141 days.

This patent is subject to a terminal disclaimer.

(21) Appl. No.: 15/771,196

(22) PCT Filed: Jul. 10, 2017

(86) PCT No.: PCT/JP2017/025144
§ 371 (c)(1),
(2) Date: Apr. 26, 2018

(87) PCT Pub. No.: WO2018/012460
PCT Pub. Date: Jan. 18, 2018

(65) Prior Publication Data
US 2018/0315586 A1  Nov. 1, 2018

(30) Foreign Application Priority Data
Jul. 13, 2016 (JP) ................. 2016-138710

(51) Int. Cl.
*C23C 14/34* (2006.01)
*H01J 37/34* (2006.01)

(52) U.S. Cl.
CPC ...... *H01J 37/3417* (2013.01); *C23C 14/3407* (2013.01)

(58) Field of Classification Search
CPC .................. C23C 14/3407; H01J 37/3417
See application file for complete search history.

(56) References Cited

U.S. PATENT DOCUMENTS

| 5,693,203 A | 12/1997 | Ohhashi et al. |
| 5,836,506 A | 11/1998 | Hunt et al. |

(Continued)

FOREIGN PATENT DOCUMENTS

| JP | 9-143707 A | 6/1997 |
| JP | 2000-64036 A | 2/2000 |

(Continued)

OTHER PUBLICATIONS

International Search Report (PCT/ISA/210) issued in PCT/JP2017/025144, dated Sep. 12, 2017.
Machine translation of Japanese publication JP-2002-294440-A, published Oct. 9, 2002.
Machine translation of Japanese publication JP-9-143707-A, published Jun. 3, 1997.

(Continued)

*Primary Examiner* — Jessee R Roe
(74) *Attorney, Agent, or Firm* — Birch, Stewart, Kolasch & Birch, LLP

(57) ABSTRACT

A process for producing a sputtering target in which a target material is diffusion-bonded to a backing plate material having an annular frame part, the method comprising:
an incorporating step of incorporating the target material inside the frame part of the backing plate material in such a manner that the uppermost position of the target material becomes higher than the uppermost position of the frame part of the backing plate material in a height direction of the frame part of the backing plate material; and
a bonding step of diffusion-bonding the target material to the backing plate material.

10 Claims, 6 Drawing Sheets

(56) References Cited

U.S. PATENT DOCUMENTS

| | | | |
|---|---|---|---|
| 6,073,830 A | 6/2000 | Hunt et al. | |
| 6,521,108 B1 | 2/2003 | Zhang | |
| 6,698,647 B1 | 3/2004 | Kim | |
| 6,840,431 B1 | 1/2005 | Kim | |
| 10,369,656 B2 * | 8/2019 | Takigawa | H01J 37/3417 |
| 2001/0023726 A1 | 9/2001 | Koenigsmann et al. | |
| 2002/0003010 A1 | 1/2002 | Shah et al. | |
| 2002/0185372 A1 | 12/2002 | Hunt et al. | |
| 2005/0051606 A1 * | 3/2005 | Perrot | B23K 20/023 228/193 |

FOREIGN PATENT DOCUMENTS

| | | |
|---|---|---|
| JP | 2000-509765 A | 8/2000 |
| JP | 2001-49426 A1 | 2/2001 |
| JP | 2001-262331 A | 9/2001 |
| JP | 2002-294440 A | 10/2002 |
| JP | 2007-505217 A | 3/2007 |
| JP | 2014-43614 A | 3/2014 |

OTHER PUBLICATIONS

Japanese Decision of Refusal dated Sep. 6, 2018 for Application No. 2017-201201, along with an English machine translation.

Japanese Decision to Grant a Patent dated Dec. 11, 2017 for Application No. 2017-134083, along with an English machine translation.

Japanese Notice of Reasons for Refusal dated Aug. 7, 2017 for Application No. 2017-134083, along with an English machine translation.

Japanese Notice of Reasons for Refusal dated Feb. 27, 2018 for Application No. 2017-201201, along with an English machine translation.

Japanese Notice of Reasons for Refusal dated Jun. 7, 2018 for Application No. 2017-201201, along with an English machine translation.

Japanese Reconsideration Report by Examiner before Appeal dated Feb. 7, 2019 for Application No. 2017-201201, along with an English machine translation.

* cited by examiner

PROCESS FOR PRODUCING SPUTTERING TARGET AND SPUTTERING TARGET

TECHNICAL FIELD

The present invention relates to a process for producing a sputtering target, and a sputtering target.

BACKGROUND ART

Conventionally, as a process for producing a sputtering target, there is a method mentioned in JP H09-143707 A (Patent Document 1). In this process for producing a sputtering target, hot isostatic pressing capable of applying isotropic pressing (hot isotropic pressing method: hot isostatic press (HIP)) is conducted to thereby perform diffusion-bonding of a target material to a backing plate material, thus producing a sputtering target.

PRIOR ART DOCUMENT

Patent Document

Patent Document 1: JP H09-143707 A

DISCLOSURE OF THE INVENTION

Problems to be Solved by the Invention

It is an object of the present invention to provide a process for producing a sputtering target that exhibits high bonding strength of a target material to a backing plate material.

Means for Solving the Problems

The process for producing a sputtering target of the present invention is a process for producing a sputtering target in which a target material is diffusion-bonded to a backing plate material having an annular frame part, the method including:

an incorporating step of incorporating the target material inside the frame part of the backing plate material in such a manner that the uppermost position of the target material becomes higher than the uppermost position of the frame part of the backing plate material in a height direction of the frame part of the backing plate material; and a bonding step of diffusion-bonding the target material to the backing plate material.

According to the process for producing a sputtering target of the present invention, the target material is incorporated inside the frame part of the backing plate material in such a manner that the uppermost position of the target material becomes higher than the uppermost position of the frame part of the backing plate material. Thereafter, the target material is diffusion-bonded to the backing plate material.

Thereby, in a case of performing diffusion-bonding of the target material to the backing plate material, for example, in a case of heating the target material by a hot plate while pressing from above, the hot plate comes in contact with the uppermost position of the target material since the uppermost position of the target material is higher than the uppermost position of the frame part of the backing plate material. Therefore, the target material can be sufficiently loaded by the hot plate to thereby produce sputtering target that exhibits high bonding strength of a target material to a backing plate material.

In an embodiment of the process for producing a sputtering target, in the bonding step, the target material is heated by a hot plate while pressing in a uniaxial direction to perform diffusion-bonding of the target material to the backing plate material.

In the present embodiment, the "hot plate" is positioned on one or both sides of the target material and the backing plate material during pressing. Hereinafter, the hot plate positioned on the target material side during pressing is sometimes referred to as "upper hot plate", while the hot plate positioned on the backing plate material during pressing is sometimes referred to as "lower hot plate".

The diffusion bonding can be performed using a hot press as mentioned later.

According to the embodiment, since the hot press can be used, the pressure required for bonding is reduced and the time required for bonding can be shortened, and the cost required for bonding can be reduced as compared with the hot isotropic pressing method.

In an embodiment of the process for producing a sputtering target, in the incorporating step, a height difference between the uppermost position of the target material and the uppermost position of the frame part of the backing plate material is adjusted to 1% or more relative to a thickness of the target material.

According to the embodiment, a height difference between the uppermost position of the target material and the uppermost position of the frame part of the backing plate material is adjusted to 1% or more relative to the thickness of the target material. Thereby, the bonding strength of the target material to the backing plate material can be increased when the target material is heated by the hot plate while pressing in the uniaxial direction, thereby diffusion-bonding the target material to the backing plate material.

In an embodiment of the process for producing a sputtering target, the material of the target material is Al or an Al alloy, and preferably Al.

According to the embodiment, since the material of the target material is Al or an Al alloy, the target material has low hardness. Therefore, when the target material is heated by the hot plate while pressing in the uniaxial direction, the target material is easily crushed to thereby eliminate a gap between the target material and the backing plate material and enhance adhesion during bonding. Therefore, the bonding strength of the target material to the backing plate material can be increased.

In an embodiment of the process for producing a sputtering target, the material of the backing plate material is a material selected from one or more of Al, Cu, Ti, Mo, W, Ta, Nb, Fe, and alloys thereof, and preferably a material selected from one or more of Al, Cu, and alloys thereof.

According to the embodiment, the backing plate material is a material selected from one or more of Al, Cu, Ti, Mo, W, Ta, Nb, Fe, and alloys thereof. Thereby, the hardness of the backing plate material can be made larger than that of the target material, to thereby suppress deformation of the backing plate material.

In an embodiment of the process for producing a sputtering target, before the incorporating step, a plating layer is provided on at least one of the backing plate material and the target material and, in the bonding step, the backing plate material and the target material are bonded together through the plating layer.

According to the embodiment, in the case of bonding by pressing from the uniaxial direction, and preferably pressing (uniaxial pressing) from above, the backing plate material and the target material can be bonded together through the plating layer even at a low temperature.

In an embodiment of the process for producing a sputtering target, before and after the bonding step, a change rate of an X-ray intensity ratio in crystal orientation of the target material is from 80% to 120%.

According to the embodiment, before and after the bonding step, deterioration of the target material can be reduced.

In an embodiment of the process for producing a sputtering target, before and after the bonding step, a change rate of a grain size in the target material is from 75% to 125%.

According to the embodiment, before and after the bonding step, deterioration of the target material can be reduced.

An embodiment of a sputtering target includes:

a backing plate material having an annular frame part; and a target material fit inside the frame part of the backing plate material;

wherein the uppermost position of the target material is higher than the uppermost position of the frame part of the backing plate material in a height direction of the frame part of the backing plate material.

According to the embodiment, the uppermost position of the target material is higher than the uppermost position of the frame part of the backing plate material in the height direction of the frame part of the backing plate material. Thereby, in a case of performing diffusion-bonding of the target material to the backing plate material, for example, in a case of heating the target material by a hot plate while pressing from above, the hot plate comes in contact with the uppermost position of the target material since the uppermost position of the target material is higher than the uppermost position of the frame part of the backing plate material. Therefore, the target material can be sufficiently loaded by the hot plate to thereby increase the bonding strength of the target material relative to the backing plate material.

An embodiment of a bonded body for producing a sputtering target includes:

a backing plate material having an annular frame part; and a target material fit inside the frame part of the backing plate material;

wherein the uppermost position of the target material is higher than the uppermost position of the frame part of the backing plate material in a height direction of the frame part of the backing plate material.

According to the embodiment, the uppermost position of the target material is higher than the uppermost position of the frame part of the backing plate material in the height direction of the frame part of the backing plate material. Thereby, in a case of performing diffusion-bonding of the target material to the backing plate material, for example, in a case of heating the target material by a hot plate while pressing from above, the uppermost position of the target material is higher than the uppermost position of the frame part of the backing plate material, so that the hot plate comes in contact with the uppermost position of the target material. Therefore, the target material can be sufficiently loaded by the hot plate to thereby increase high bonding strength of the target material to the backing plate material.

Effects of the Invention

According to the process for producing a sputtering target of the present invention, a target material is incorporated inside the frame part of the backing plate material in such a manner that the uppermost position of the target material becomes higher than the uppermost position of the frame part of the backing plate material. Thereafter, the target material is diffusion-bonded to the backing plate material. Thereby, the bonding strength of the target material to the backing plate material can be increased.

MODE FOR CARRYING OUT THE INVENTION

Figure 1:
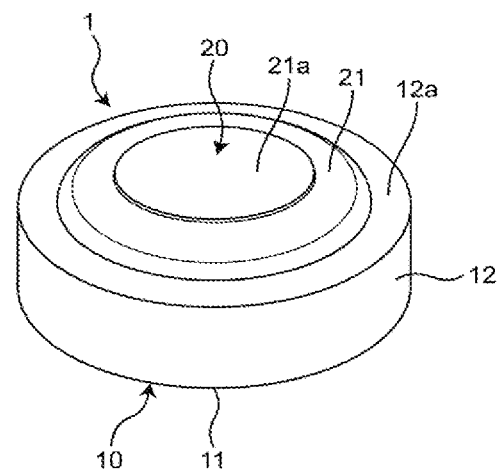
FIG. 1 It is a perspective view showing a first embodiment of a sputtering target of the present invention.

The present invention will be described in detail below with reference to the embodiments shown in the drawings.

First Embodiment

Figure 2:
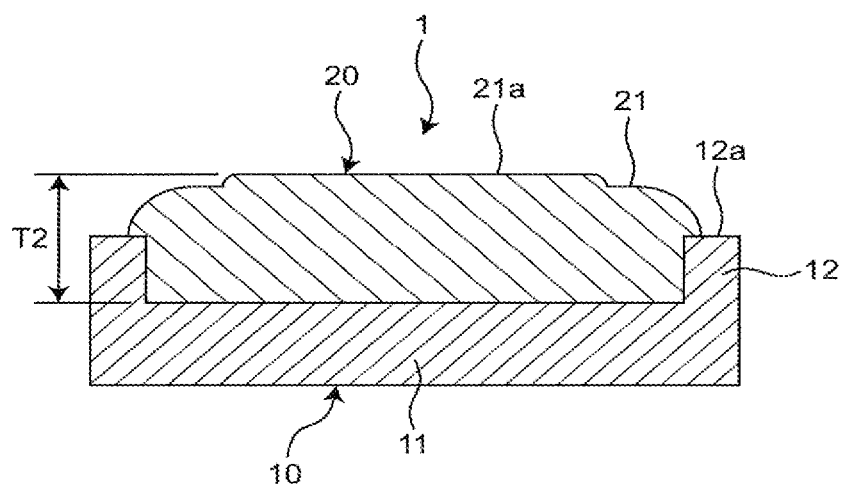
FIG. 2 It is a cross-sectional view of a sputtering target of a first embodiment.

FIG. 1 is a perspective view showing a first embodiment of a sputtering target of the present invention. FIG. 2 is a cross-sectional view of the sputtering target. As shown in FIG. 1 and FIG. 2, a sputtering target 1 includes a backing plate material 10 and a target material 20 bonded to a top face of the backing plate material 10. The backing plate material 10 includes a base plate 11 and an annular frame part 12 provided along an outer periphery of the top face of the base plate 11. The target material 20 is fitted inside the frame part 12 of the backing plate material 10 and is diffusion-bonded to the top face of the base plate 11. A height direction of the frame part 12 is a vertical direction, a side of the base plate 11 is a bottom side, and a side opposite to the base plate 11 is a top side. The backing plate material 10 and the target material 20 are formed into a circular shape when viewed from above. The backing plate material 10 and the target material 20 may be formed into an oval shape, an ellipse shape, a polygonal shape, or the like.

The uppermost position of the target material 20 is higher than the uppermost position of the frame part 12 of the backing plate material 10 in a height direction of the frame part 12 of the backing plate material 10. In other words, a top face 21 of the target material 20 projects upward from a top face 12a of the frame part 12 of the backing plate material 10. The top face 21 includes a circular projecting part 21a which projects upward in the center part thereof.

The top face 21 of the target material 20 includes a sputtering face for receiving an inert gas being plasmatized (or being ionized) during sputtering. Target atoms contained in the target material 20 are sputtered out from the sputtering face with which the inert gas collides. The sputtered atoms are accumulated on a substrate arranged facing to the sputtering face to form a thin film on the substrate.

The target material 20 can be produced from a material selected from the group consisting of metals of, for example, aluminum (Al), copper (Cu), chrome (Cr), iron (Fe), tantalum (Ta), titanium (Ti), zirconium (Zr), tungsten (W), molybdenum (Mo), niobium (Nb), etc. and alloys thereof, and the material constituting the target material 20 is not limited thereto. The material of the target material 20 is preferably a material which has hardness smaller than that of the backing plate material and is easily deformed during diffusion bonding. Specifically, the material is preferably Al or an Al alloy. Particularly used are Al in which a base material, except for additive elements, has Al purity of preferably 99.99% or more, more preferably 99.999% or more, and still more preferably 99.9999% or more. When the purity of Al increases, the hardness of the base material (target material) decreases, leading to formation due to pressing, thus making it possible to further enhance the bondability with the backing plate material. When Al is used as the target material, from the viewpoint of alloy spikes, electromigration, etc., Si, Cu, Nd, Mg, Fe, Ti, Mo, Ta, Nb, W, Ni, Co, and the like may be added as an additive element. Preferably, an Al—Cu alloy (e.g., Al-1.0% Cu, Al-0.5% Cu, etc.), an Al—Si alloy (e.g., Al-1.0% Si, Al-0.5% Si, etc.), and an Al—Cu—Si alloy (e.g., Al-1.0% Si-0.5% Cu, etc.) are used. It is particularly preferred to use Al having Vickers hardness of 50 or less, preferably 45 or less, and more preferably 40 or less.

The material of the backing plate material 10 may be the same as that of the target material 20. Preferably, the material of the backing plate material 10 is a material selected from one or more of aluminum (Al), copper (Cu), titanium (Ti), tungsten (W), molybdenum (Mo), tantalum (Ta), niobium (Nb), iron (Fe), and alloys thereof. Preferably, the hardness of the backing plate material 10 is larger than the hardness of the target material 20. When the target material 20 is Al or an Al alloy, preferably used are, for example, an A2024 alloy, purified Cu, a Cu—Cr alloy, SUS304, an A5052 alloy, an A5083 alloy, an A6061 alloy, an A7075 alloy, and the like. Deformation of the backing plate material can be suppressed by adjusting the Vickers hardness to more than 50, preferably 100 or more, more preferably 110 or more, and still more preferably 130 or more.

A diameter of the backing plate material 10 is, for example, 120 mm to 850 mm, preferably 250 mm to 650 mm, and more preferably 300 mm to 550 mm, and a diameter of the target material 20 is, for example, 90 mm to 700 mm, preferably 200 mm to 600 mm, and more preferably 300 mm to 500 mm, which are suitable as the backing plate material 10 and the target material 20 to be used for diffusion bonding. The diameter of the backing plate material 10 and the diameter of the target material 20 are not limited thereto but, from the viewpoint of work efficiency, the diameter of the inside of the frame material 12 of the backing plate material 10, to which the target material 20 is incorporated, is preferably made larger than the diameter of the target material 20 to be incorporated. When a distance between an outer periphery of the target material 20 and an inner periphery of the frame material 12 of the backing plate material 10 is too large, the amount of deformation of the target material 20 generated in a direction other than a pressuring direction increases, thus failing to obtain sufficient bonding strength, leading to a change in crystallinity of the target material 20 easily. Preferably, the diameter of the inner periphery in the frame material 12 of the backing plate material 10 is made larger by 0.1 mm to 10 mm, preferably 0.2 mm to 5 mm, and more preferably 0.3 mm to 1 mm than the target material 20 to be incorporated.

Figure 3:
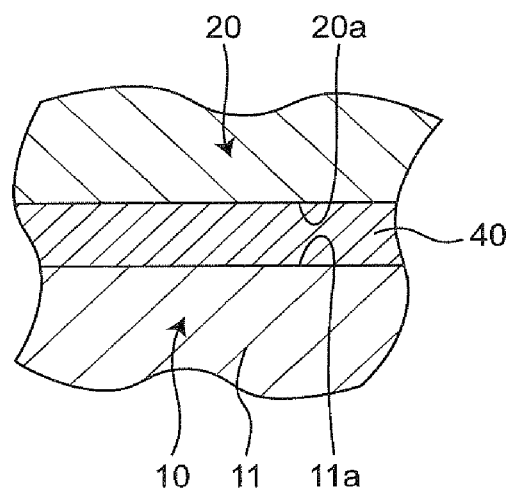
FIG. 3 It is an enlarged cross-sectional view of a sputtering target of a first embodiment.

FIG. 3 is an enlarged view of FIG. 2. As shown in FIG. 3, a plating layer 40 can be provided between the backing plate material 10 and the target material 20. The plating layer 40 thus provided enables enhancement of bonding between the backing plate material 10 and the target material 20. More specifically, the plating layer 40 is provided at least between a top face 11a of the base plate 11 and a bottom face 20a of the target material 20. The material of the plating layer 40 is silver, and may be metal such as chrome, zinc, copper, or nickel. The plating layer 40 is formed in advance on at least one of the backing plate material 10 and target material 20 by a general plating method such as electrolytic plating or electroless plating. When producing a large amount of sputtering target, an electrolytic plating method with high plating rate (mention is made, for example, in JP S58-55237 A2, JP 2010-222617 A, and JP 2009-149965 A) are generally preferred. When the plating layer 40 is provided on the surfaces of the backing plate material 10 and the target material 20, the surfaces may be provided with a layer of metal such as copper or zinc, as an underlying layer, by plating, followed by formation of a silver layer on the copper layer or the zinc layer by plating. At this step, the plating layer 40 includes a layer of metal such as copper or zinc, in addition to the silver layer. As mentioned above, the plating layer 40 may be a single layer or multiple layers.

FIG. 2 shows a sputtering target 1. The sputtering target 1 of FIG. 2 may be a bonded body for producing a sputtering target. Thereafter, the frame part 12 of the backing plate material 10 and the top face 21 of the target material 20 of the bonded body for producing a sputtering target may be shaved off by machining using a milling machine, an NC milling machine, a machining center, a lathe, an NC lathe, and the like, to obtain a sputtering target finished into a desired size and surface state.

A process for producing a sputtering target 1 will be described below.

Figure 4:
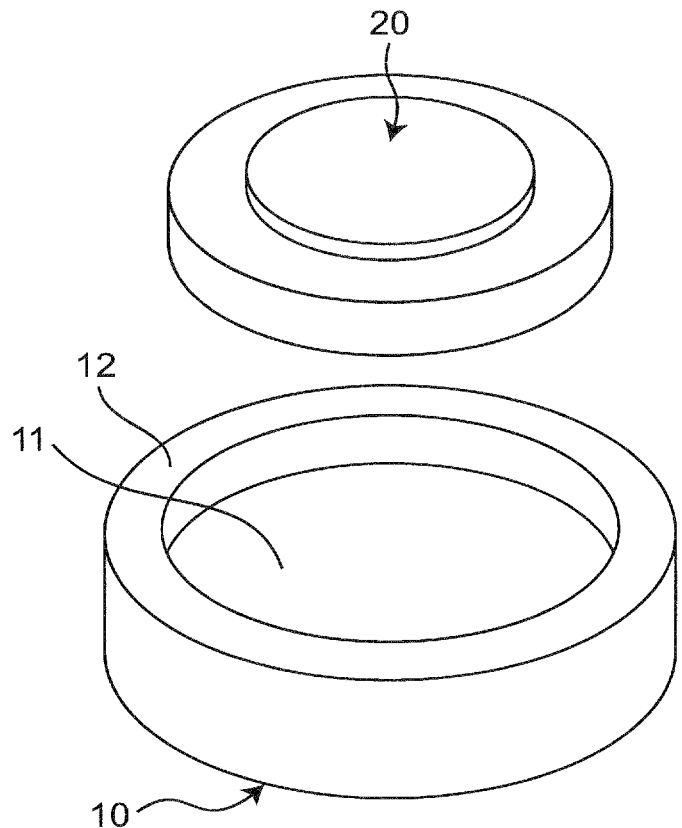
FIG. 4 It is an explanatory drawing explaining a process for producing a sputtering target of a first embodiment.

As shown in FIG. 4, a metal material is cut using a milling machine, an NC milling machine, a machining center, a lathe, an NC lathe, and the like to prepare a backing plate material 10 and a target material 20. Then, the backing plate material 10 and the target material 20 are subjected to silver plating. At this step, a top face of the base plate 11 and an inner peripheral surface of the frame part 12, and a bottom face and a side surface of the target material 20 (i.e., parts where the backing plate material 10 and the target material 20 come in contact with each other) are subjected to silver plating (plating layer 40 of FIG. 3). Preferably, the top face of the base plate 11 and the bottom face of the target material 20 are provided with silver plating. The silver plating may be provided over the entire surface of the backing plate material 10 and the target material 20. In this procedure, silver plating on the top face 21 (sputtering face) of the target material 20 does not need to be removed in the final step. Treatments such as a degreasing treatment, an acid treatment, an alkali treatment, and rinsing may be performed as a pretreatment for providing a plating layer. These treatments can be performed by a known method. When the material of the target material 20 and the backing plate material 10 is Al or an Al alloy, a strong oxide film is formed on the Al surface and a plating treatment on the surface can hardly be performed so that a zincate treatment may be performed before the plating treatment. The zincate treatment can be performed by a known method and, for example, the target material and the backing plate material are immersed in a zincate solution containing sodium hydroxide and zinc oxide, and preferably a zincate solution further containing a complexing agent and metal salt. The Al surface is substituted with Zn by the zincate treatment to thereby prevent or suppress reoxidation of the activated surface. After the zincate treatment, the materials are immersed in a zincate peeling solution such as a nitric acid to thereby peel off a zinc-substituted coating film, and perform the zincate treatment again, resulting that a denser and uniform zinc-substituted coating film can be formed. The zincate treatment may be repeated three times or more. Before providing a silver plating layer used for bonding, to prevent poor plating adhesion such as swelling and peeling of the plating layer, a strike plating treatment may be carried out using nickel, copper, silver, etc., and alloys containing these metals. For example, when the strike plating treatment is performed using copper, a copper strike plating layer can be formed by electrolytic plating in a plating solution containing copper cyanide or copper pyrophosphate.

Figure 5:
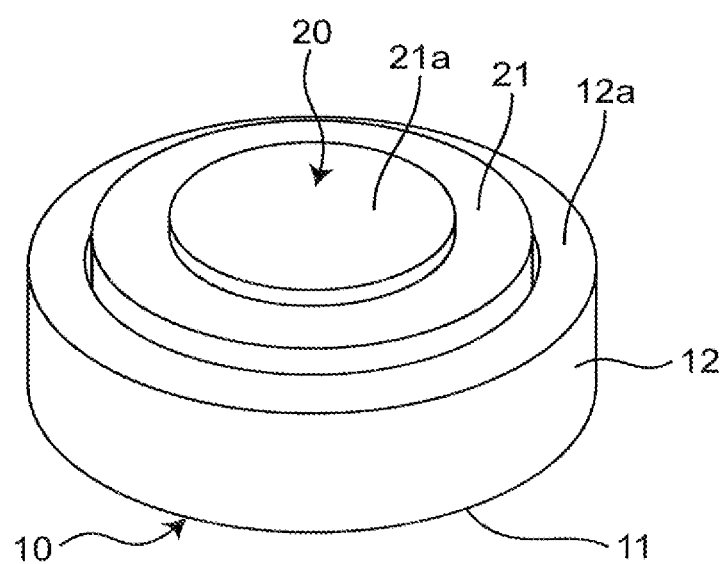
FIG. 5 It is an explanatory drawing explaining a process for producing a sputtering target of a first embodiment.
Figure 6:
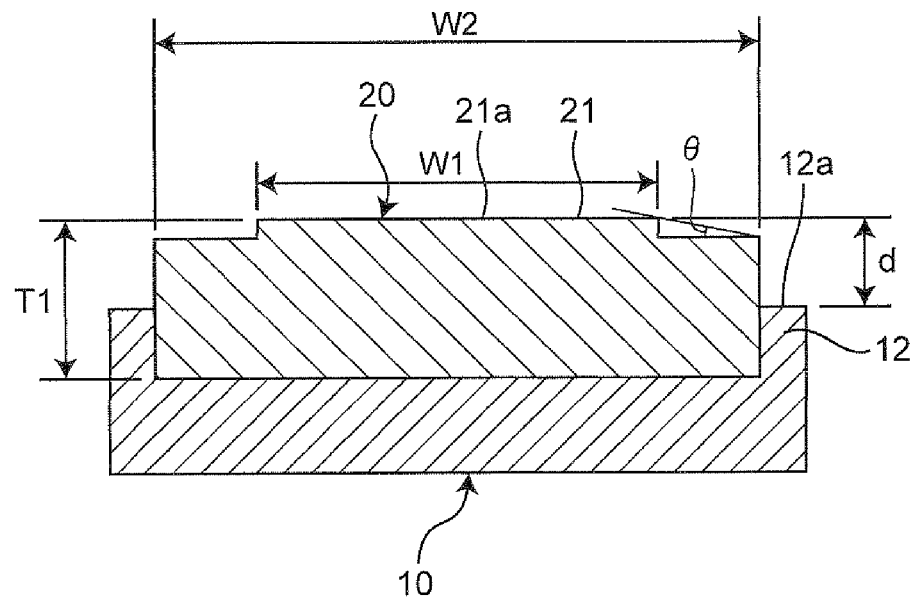
FIG. 6 It is an explanatory drawing explaining a process for producing a sputtering target of a first embodiment.

Then, as shown in FIG. 5, the target material 20 is incorporated inside the frame part 12 of the backing plate material 10. This is called an incorporating step. At this step, as shown in FIG. 6, the uppermost position of the target material 20 is set to be higher than the uppermost position of the frame part 12 of the backing plate material 10 in the height direction of the frame part 12 of the backing plate material 10. The uppermost position of the target material 20 is the position of the projecting part 21a formed on the top face 21 of the target material 20. The uppermost position of the frame part 12 of the backing plate material 10 is the position of the top face 12a of the frame part 12.

Figure 7:
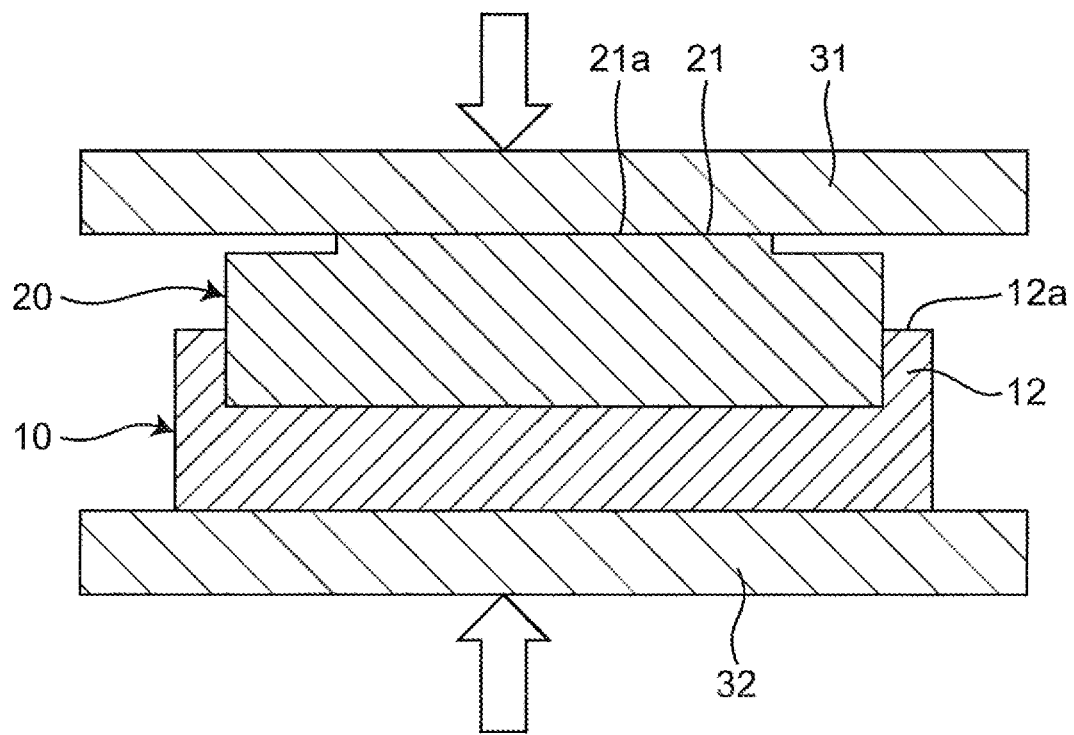
FIG. 7 It is an explanatory drawing explaining a process for producing a sputtering target of a first embodiment.

After the incorporating step, the top face 21 (projecting part 21a) of the target material 20 is heated while pressing in the uniaxial direction, preferably from above, using a hot plate (preferably, upper hot plate 31), to thereby perform diffusion-bonding of the target material 20 to the backing plate material 10. For example, as shown in FIG. 7, the target material 20 is diffusion-bonded to the backing plate material 10. At this step, the backing plate material 10 and the target material 20 are sandwiched from the upper and lower sides by the upper heating plate 31 and the lower heating plate 32, heated and then pressed in the vertical direction. This is called hot pressing. Namely, the backing plate material 10 and the target material 20 are bonded via the plating layer.

In the hot pressing step, a known hot press machine can be used. When pressing the backing plate material 10 and the target material 20 in the vertical direction, only the upper hot plate 31 may be pressed downward in a state where the lower hot plate 32 is fixed. Alternatively, only the lower hot plate 32 may be pressed upward in a state where the upper hot plate 31 is fixed. The pressing direction is not necessarily required to be the vertical direction as long as an assembly composed of the backing plate material 10 and the target material 20 can be fixed so as not to interfere with bonding, and the backing plate material 10 and the target material 20 may be placed in parallel with the vertical direction and bonded by pressing in the horizontal direction. To uniformly bond without forming the unbonded portion, bonding is performed by pressing in the vertical direction. FIG. 7 shows an example of a method for installing an assembled body in which the target material 20 is incorporated inside the backing plate material 10 on the hot plate. However, the target material 20 may be placed on a top side (the top face 21 of the target material 20 comes in contact with the upper hot plate 31) or may be placed on a bottom side (the top face 21 of the target material 20 comes in contact with the lower hot plate 32). At this step, a surface of the hot plate that comes in contact with the top face 21 of the target material 20 can be called a press surface.

An example of the conditions for hot pressing will be described below. The hot pressing step consists of a preheating step of preheating an assembled body in which a target material 20 is incorporated inside a backing plate material 10, and a subsequent pressing step. When the size of the target material is φ450 mm, the temperature of the hot plate during hot pressing depends on the composition of the target material, and is 200° C. to 500° C., preferably 220° C. to 400° C., and more preferably 230° C. to 330° C. Preferably, preheat is conducted in such a manner that the temperature of the target material reaches the temperature different by ±20° C., preferably ±10° C., from that of the hot plate. The temperature of the hot plate during preheating is 190° C. to 500° C., preferably 210° C. to 400° C., and more preferably 220° C. to 370° C., and the preheating time is 5 minutes or more, preferably 5 minutes to 60 minutes, and more preferably 10 minutes to 30 minutes. An example of the preheating method includes a method which includes placing, on the lower hot plate, the target material 20 is incorporated inside the backing plate material 10, and then statically placing the upper hot plate in a state close to the target material of the assembly, i.e., immediately above the top face 21 of the target material of the assembly or at a position which is preferably more than 0 mm and 50 mm or less, more preferably 10 mm to 40 mm, and still more preferably 15 mm to 30 mm, away from the top face of the target material. The pressure to be applied to the assembled body in which the target material 20 is incorporated inside the backing plate material 10 during hot pressing is 8 MPa or more, preferably 10 MPa to 80 MPa, and more preferably 25 MPa to 70 MPa, and the pressing time is 10 minutes or more, preferably from 10 minutes to 60 minutes or less, and more preferably 20 minutes to 40 minutes. When the size of the target material increases, the pressure to be applied also increases.

The material constituting the upper hot plate 31 and the lower hot plate 32 is preferably a high strength alloy such as an alloy steel or a carbon steel to thereby use, for example, chromium molybdenum steels such as SCM430 and SCM440, stainless steels such as SUS304 and SUS316, and carbon steels such as S45C and S60C.

There is no particular limitation on the shape of the upper hot plate 31 and the lower hot plate 32, and the surface, against which the target material is pressed, may have a circular, rectangular, square quadrangular, or other polygonal shape. The size of the upper hot plate 31 and the lower hot plate 32 may be any size as long as it enables pressing the entire target material 20. The size may be determined in accordance with the size of the target material 20. For example, to press a target material having a size of φ450 mm and a backing plate material having a size of φ550 mm, the size of 1,000 mm×1,000 mm×t100 mm can be used in the case of a square hot plate. The size of the hot plate on the side in contact with the backing plate material 10 may be substantially equal to or larger than the size of the backing plate material. Regarding the size of the hot plate on the side in contact with the upper surface 21 of the target material 20, the length of one side of the pressing surface is 0.8 to 5 times, preferably 1 to 3 times, and more preferably 1.2 to 2.5 times the size of the target material.

Mention is made of the above diffusion bonding, more specifically, the top surface 21 of the target material 20 is heated from above while pressing in the uniaxial direction by the bottom face of the upper hot plate 31, at the center part (the protruding portion 21a) prior to the outer peripheral part of the top surface 21, to thereby perform diffusion-bonding of the target material 20 to the backing plate material 10. At this step, the bottom face of the upper hot plate 31 is flat, but the center part (projecting part 21a) of the top face 21 of the target material 20 projects upward from the outer peripheral part of the top face 21, so that the top face 21 of the target material 20 can be pressed by the upper hot plate 31, at the center part (projecting part 21a) prior to the outer peripheral part of the top face 21, with a simple procedure. The shape of the projecting part 21a is composed of a single ramp but may be composed of multiple ramps. The top face of the projecting part 21a is flat but may be a convex curved surface. When the top face of the projecting part 21a is a convex curved surface, a region, which comes in contact with the bottom face of the projecting part 21a during pressing by the bottom face of the upper hot plate 31, followed by being pressed, can be regarded as the center part of the top face 21 of the target material 20.

A width W1 of the projecting part 21a usually accounts for 30% or more of a width W2 (diameter) of the target material, and preferably 40 to 60% so as to increase the bonding strength in the center part of the target material 20. The degree of projection from the top surface 21 of the projecting part 21a can be judged by an angle θ, which is formed by a line segment connecting an outer peripheral end edge of the outer peripheral part of the top face 21 and an outer peripheral end edge of the projecting part 21a, and the outer peripheral part of the top face 21 in a vertical section of the target material 20. The angle θ formed by the above-mentioned line segment and the outer peripheral part of the top face 21 is preferably 0.05° or more, more preferably 0.05° to 0.50°, and still more preferably 0.10° to 0.30°. When the angle θ is in the above range, the pressure from the upper hot plate 31 can be effectively transferred to the target material 20 and the backing plate material 10, to thereby increase bonding strength. When an upper section of the projecting part 21a is composed of multiple ramps, the maximum angle among the angles, which is formed by the line segment connecting the outer peripheral end edge of the outer peripheral part of the top face 21 and the outer peripheral end edge of each ramp of the projecting part, and the outer peripheral part of the top face 21, may be in the above range. When the shape of the projecting part 21a is a convex curved surface, the maximum angle among the angles, formed by the line segment in contact with the convex curves surface and the outer peripheral part of the top face 21, may be in the above range.

According to the process of the first embodiment, a sputtering target 1 as shown in FIG. 2 is manufactured. By hot pressing, a thickness after pressing T2 of the target material 20 becomes smaller than a thickness before pressing T1 as shown in FIG. 7. Finish cutting may be performed after bonding the target material 20 to the backing plate material 10. Preferably, a milling machine, an NC milling machine, a machining center, a lathe, an NC lathe, and the like are used for finish cutting of the sputtering target 1.

According to the process for producing a sputtering target 1, the target material 20 is incorporated inside the frame part 12 of the backing plate material 10 in such a manner that the uppermost position of the target material 20 becomes higher than the uppermost position of the frame part 12 of the backing plate material 10. Thereafter, the target material 20 is diffusion-bonded to the backing plate material 10.

Thereby, when the target material 20 is heated by the upper hot plate 31 while pressing the target material 20 from above, the uppermost position of the target material 20 is higher than the uppermost position of the frame part 12 of the backing plate material 10, so that the upper hot plate 31 comes in contact with the uppermost position of the target material 20. Therefore, the target material 20 can be loaded by the upper hot plate 31, to thereby increase bonding strength of the target material 20 to the backing plate material 10.

According to the process of the first embodiment, owing to use of hot pressing, as compared with the hot isotropic pressing method, the pressure required for bonding is reduced and the time required for bonding is shortened and the cost required for bonding is reduced.

According to the process of the first embodiment, since the backing plate material 10 and the target material 20 are bonded together through the plating layer 40, in the case of bonding by pressing from the uniaxial direction, preferably from above (uniaxial press), the backing plate material 10 and the target material 20 can be certainly bonded together even at a temperature lower than a temperature of the case where the plating layer 40 is not provided, for example, 200° C. to 500° C., preferably 220° C. to 400° C., and more preferably 230° C. to 330° C. Particularly, when the target material 20 is made of a relatively low melting metal such as Al and an Al alloy, bonding can be achieved at the above-mentioned low temperature via the plating layer, thus enabling suppression of deterioration (change in crystallinity) of the target material 20.

In the first embodiment, the top face 11a of the base plate 11 of the backing plate material 10 and the bottom face 20a of the target material 20 are preferably bonded together through the plating layer 40. By hot pressing, a force can be transmitted to the top face 11a of the backing plate material 10 and the bottom face 20a of the target material 20 without resistance, to thereby increase adhesion at the bonding surface and increase bonding strength. Since the hot pressing is uniaxial pressing, there is no need to apply a force that enables bonding to a side surface of the target material 20 and an inner peripheral surface of the frame part 12 of the backing plate material 10, and there is no need to bond the side surface of the target material 20 to the backing plate material 10. If the side surface of the target material 20 is not bonded to the backing plate 10, in the case of finishing to obtain a sputtering target having a backing plate shape in which the bonding surface side is flat or the frame part slightly remains, the frame part of the backing plate can be cut out in a circumference direction at a root thereof to thereby reduce cutting time.

In the first embodiment, the material of the target material 20 is preferably Al or an Al alloy, and the hardness of the target material 20 becomes smaller than the hardness of the backing plate material 10. Therefore, when the target material 20 is heated by the upper hot plate 31 while pressing from above, the target material 20 is easily crushed to eliminate a gap between the target material 20 and the backing plate material 10 and to enhance adhesion during bonding. Therefore, the bonding strength of the target material 20 to the backing plate material 10 can be increased.

In the first embodiment, the backing plate material 10 is a material selected from one or more of Al, Cu, Ti, Mo, W, Ta, Nb, Fe, and alloys thereof, and the hardness of the backing plate material 10 can be made larger than the hardness of the target material 20. Thereby, deformation of the backing plate material 10 can be suppressed.

In the first embodiment, as shown in FIG. 6, in the incorporating step, a height difference "d" between the uppermost position (projecting part 21a) of the target material 20 and the uppermost position (top face 12a) of the frame part 12 of the backing plate material 10 is adjusted to 1% or more, preferably 5% or more, more preferably 7% or more, and still more preferably 10% or more, relative to the thickness before pressing T1 of the target material 20. Namely, d/T1 is adjusted to 1% or more, preferably 5% or more, more preferably 7% or more, and still more preferably 10% or more.

According to the above preferred embodiment, when the target material 20 is heated by the hot plate 31 while pressing in the uniaxial direction, preferably from above, to thereby perform diffusion-bonding of the target material 20 to the backing plate material 10, the bonding strength of the target material 20 to the backing plate material 10 can be increased.

Figure 8:
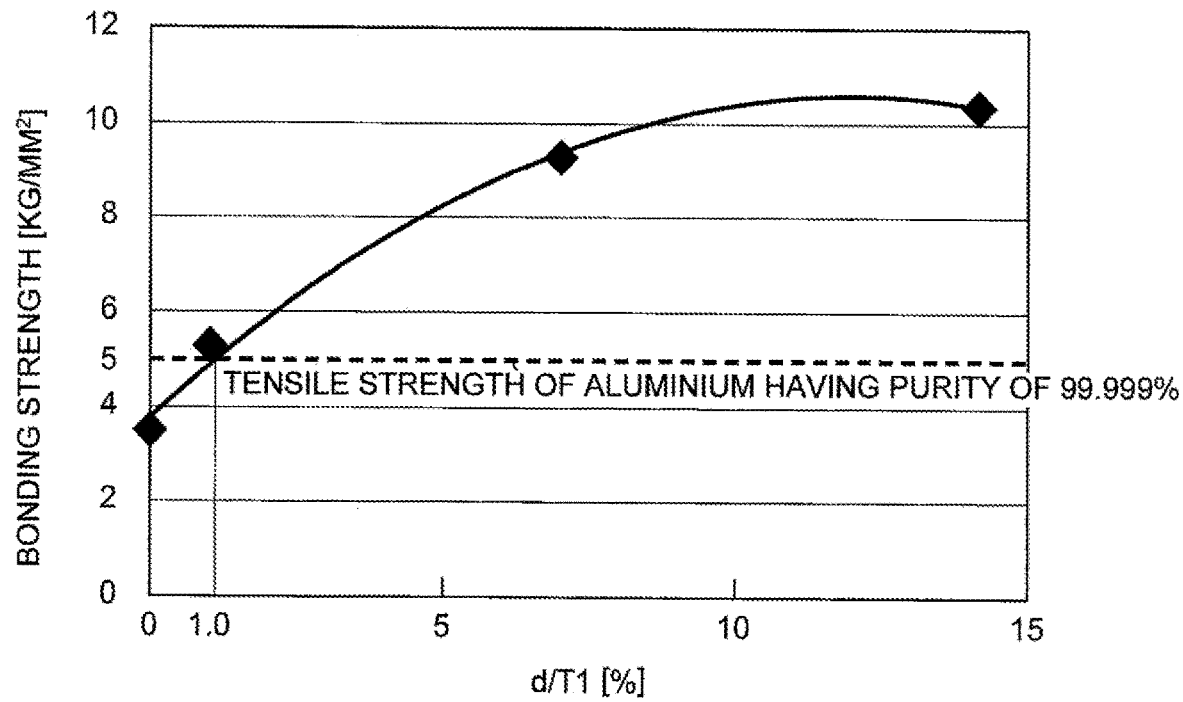
FIG. 8 It is a graph showing a relationship between a height difference d/thickness before pressing T1 [%] and a bonding strength [kg/mm$^2$].

FIG. 8 shows a relationship between a height difference d/thickness before pressing T1 [%] and bonding strength [kg/mm$^2$]. This relationship is established regardless of the diameter of the target material 20. The bonding strength is a strength at a time of breaking a sputtering target 1 when a backing plate material 10 and a target material 20 are pulled respectively in an opposite direction to each other using a tension tester (universal testing machine UH-500kNIR, manufactured by Shimadzu Corporation).

FIG. 8 shows the results obtained when a target material 20 of Al-0.5% Cu having a size of φ90 mm×t10.0 mm provided with a projecting part having a size of φ34 mm×t0.2 mm, and a backing plate material 10 of a A2024 alloy having a size of φ120 mm×t25 mm provided with a φ90.3 mm recess part having a predetermined depth at the center are diffusion-bonded together via a silver plating layer under the conditions of a pressure of 56 MPa, a bonding temperature of 270° C., a preheating time of 10 minutes, and a pressing time of 30 minutes. The silver plating treatment was applied to bonding surface side of the target material and the backing plate material, followed by a zincate treatment and a coper strike plating and further formation of a silver plating layer having a thickness of about 10 μm using an electrolytic plating method. In hot pressing, a hot press machine was used, the hot press machine being a machine (model number: MSF-1000HP) manufactured by MORI IRON WORKS CO., LTD. equipped with an upper hot plate and a lower hot plate, each is made of SCM440 and has a size of 1,000 mm×1,000 mm×t100 mm. An assembled body composed of a backing plate material and a target material placed on a lower hot plate was heated while moving an upper hot plate in a vertically downward direction and pressing from above. A bonding strength was measured using a test piece sampled from a sputtering target 1 obtained by diffusion bonding. The test piece has a size of 10 mm in wide×15 mm in depth×19 mm in height. To adjust the width of the center part in a height direction to 4 mm, a section having a size of 3 mm in width×15 mm in depth×3 mm in height was cut out from both sides in a width direction to form a neck (area of bonding part in test piece measures 4 mm in width×15 mm in depth) for the sake of easy measurement of the bonding strength at the bonding part. The test piece was sampled from the vicinity of the outer peripheral part of the sputtering target. In the case of strong bonding between the backing plate material 10 and the target material 20 is high, breakage occurs at the target material 20. In the case of weak bonding between the backing plate material 10 and the target material 20, breakage occurs at the bonding surface between the backing plate material 10 and the target material 20.

As the comparative example, as shown in FIG. 8 by a dotted line, a tensile strength of aluminum having high purity of 99.999% is 5 kg/mm$^2$. In other words, if the target material 20 is aluminum having high purity of 99.999%, it can be said that breakage occurs at the bonding surface between the backing plate material 10 and the target material 20 when the bonding strength is less than 5 kg/mm$^2$.

As is apparent from FIG. 8, when d/T1 is 1% or more, the bonding strength became larger than 5 kg/mm$^2$, and the bonding strength of the target material 20 to the backing plate material 10 increased. Meanwhile, when d/T1 was less than 1%, the bonding strength became smaller than 5 kg/mm$^2$, and the bonding strength of the target material 20 to the backing plate material 10 decreased.

In short, due to the existence of the height difference "d", when the target material 20 is pressed by the upper hot plate 31, the target material 20 can be loaded before the upper hot plate 31 comes in contact with the top face 12a of the frame part 12. As a result, the bonding strength was able to be increased. To the contrary, if no height difference "d" exists, when the target material 20 is pressed by the upper hot plate 31, the upper hot plate 31 comes firstly in contact with the top face 12a of the frame part 12, thus failing to apply sufficient load to the target material 20.

Figure 9:
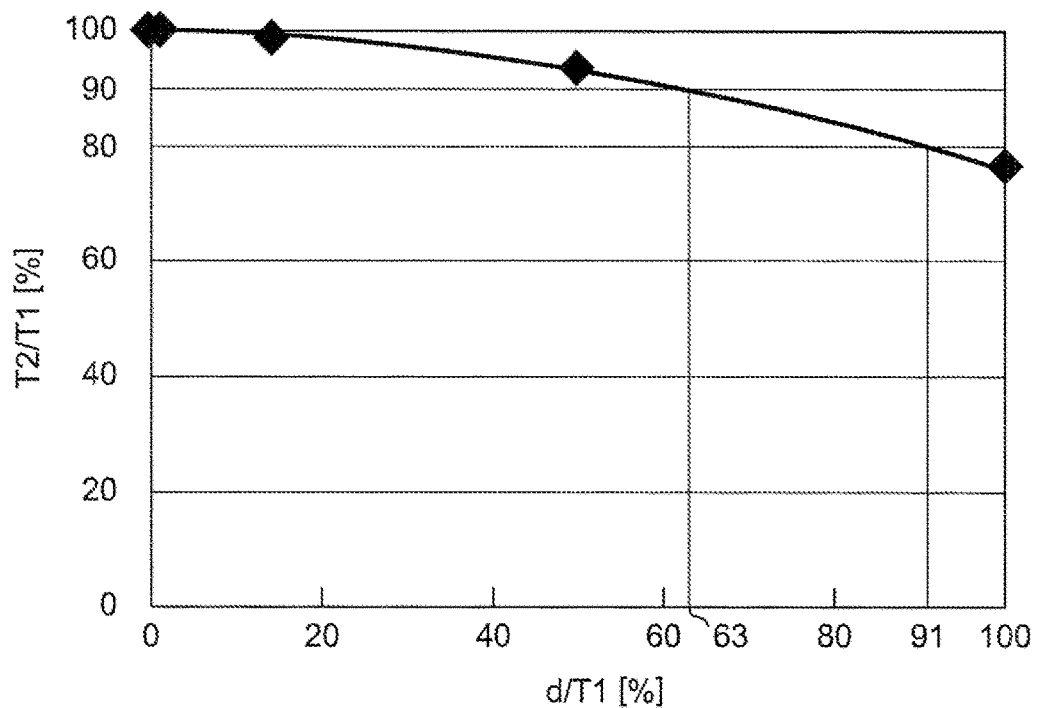
FIG. 9 It is a graph showing a relationship between a height difference d/thickness before pressing T1 [%] and a thickness after pressing T2/thickness before pressing T1 [%].

FIG. 9 shows a relationship between the height difference d/thickness before pressing T1 [%] and a thickness after pressing T2/thickness before pressing T1 [%]. This relationship is established regardless of the diameter of the target material 20. FIG. 9 shows the results obtained when a target material 20 of Al-0.5% Cu having a size of φ90 mm×t10.0 mm provided with a projecting part having a size of φ34 mm×t0.2 mm, and a backing plate material 10 of a A2024 alloy having a size of φ120 mm×t25 mm provided with a φ90.3 mm recess part having a predetermined depth at the center are diffusion-bonded together through a silver plating layer under the conditions of a pressure of 56 MPa, a bonding temperature of 270° C., a preheating time of 10 minutes, and a pressing time of 30 minutes. The silver plating treatment was applied to bonding surface side of the target material and the backing plate material, followed by a zincate treatment and a coper strike plating and further formation of a silver plating layer having a thickness of about 10 μm using an electrolytic plating method. In hot pressing, a hot press machine was used, the hot press machine being a machine (model number: MSF-1000HP) manufactured by MORI IRON WORKS CO., LTD. equipped with an upper hot plate and a lower hot plate, each is made of SCM440 and has a size of 1,000 mm×1,000 mm×t100 mm. An assembled body composed of a backing plate material and a target material placed on a lower hot plate was heated while moving an upper hot plate in a vertically downward direction and pressing from above.

As is apparent from FIG. 9, T2/T1 decreased as d/T1 increased. In other words, when the height difference "d" became larger, the amount of target material 20 crushed by the pressure applied from the upper hot plate 31 increases, resulting that thickness after pressing T2 of the target material 20 increases. As mentioned above, as the height difference d increases, the waste amount of the target material 20 due to crushing increased. For example, if T2/T1 is desired to be adjusted to 90%, d/T1 is adjusted to 63%. If T2/T1 is desired to be adjusted to 80%, d/T1 is adjusted to 91%

Accordingly, as shown in FIG. 8 and FIG. 9, a ratio of the height difference d (d/T1) is preferably determined considering the bonding strength of the target material 20 to the backing plate material 10 and the crush amount of the target material 20 (T2/T1).

Figure 10:
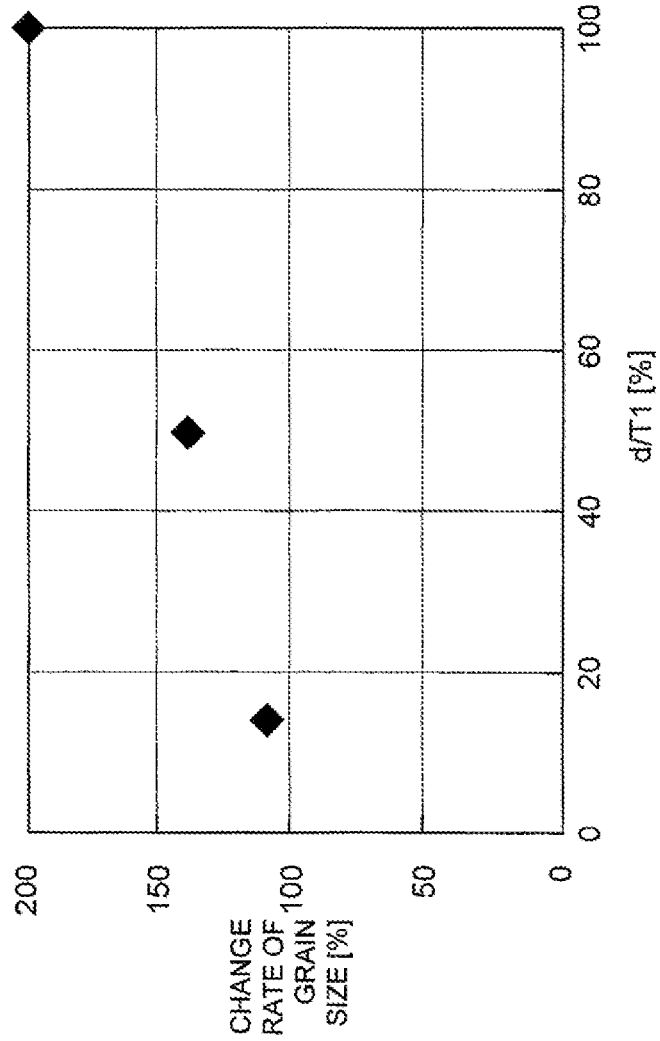
FIG. 10 It is a graph showing a relationship between a height difference d/thickness before pressing T1 [%] and a change rate of a grain size in a target material before and after hot pressing [%].

FIG. 10 shows a height difference d/thickness before pressing T1 [%] and a change rate [%] of a grain size in the target material before and after hot pressing. FIG. 10 shows the results obtained when a target material 20 of Al-0.5% Cu having a size of φ90 mm×t10.0 mm provided with a projecting part having a size of φ34 mm×t0.2 mm, and a backing plate material 10 of a A2024 alloy having a size of φ120 mm×t25 mm provided with a φ90.3 mm recess part having a predetermined depth at the center are diffusion-bonded together through a silver plating layer under the conditions of a pressure of 56 MPa, a bonding temperature of 270° C., a preheating time of 10 minutes, and a pressing time of 30 minutes.

The silver plating treatment was applied to bonding surface side of the target material and the backing plate material, followed by a zincate treatment and a coper strike plating and further formation of a silver plating layer having a thickness of about 10 μm using an electrolytic plating method. In hot pressing, a hot press machine was used, the hot press machine being a machine (model number: MSF-1000HP) manufactured by MORI IRON WORKS CO., LTD. equipped with an upper hot plate and a lower hot plate, each is made of SCM440 and has a size of 1,000 mm×1,000 mm×t100 mm. An assembled body composed of a backing plate material and a target material placed on a lower hot plate was heated while moving an upper hot plate in a vertically downward direction and pressing from above. A grain size means an average grain size, which was calculated according to a cutting method of JIS H 0501 after sampling a test piece having a size of 15 mm×15 mm×t10 mm from the vicinity of a surface layer of the center part and an end part of the target material. Thereafter, a value before and after hot pressing was obtained and a change rate of the grain size in the target material was determined.

As is apparent from FIG. 10, when d/T1 increases, the grain size of the target material 20 after hot pressing increases and the change rate also increases. In other words, when the height difference d increases, the amount of the target material 20 crushed by the pressure applied from the upper hot plate 31, and thus the crystallinity of the target material easily changes. Therefore, as shown in FIG. 6, in the incorporating step, the height difference d between the uppermost position (projecting part 21a) of the target material 20 and the uppermost position (top face 12a) of the frame part 12 of the backing plate material 10 is adjusted to 50% or less, preferably less than 50%, more preferably 30% or less, and still more preferably 20% or less, relative to the thickness before pressing T1 of the target material 20. Thereby, when the target material is heated by the hot plate while pressing in the uniaxial direction, preferably from above, to thereby perform diffusion-bonding of the target material to be bonded to the backing plate material, a change in grain size of the target material before and after bonding, can be suppressed preferably to the change within ±20% or less. In the case of metal, the grain size of the target material is generally adjusted in casting or subsequent heating and plastic working, and a change in grain size and crystallinity is preferably avoided at a stage of bonding.

Table 1 shows a change rate of an X-ray intensity ratio in each crystal orientation of the target material before and after hot pressing.

TABLE 1

| | | Change rate of X-ray intensity ratio before and after hot pressing (%) | | | | | | |
|---|---|---|---|---|---|---|---|---|
| Crystal | | Temperature | | | | | | |
| | orientation | 240° C. | 250° C. | 260° C. | 270° C. | 280° C. | 300° C. | 320° C. |
| Target material 1 | (200) | 106 | 109 | 91 | 97 | 103 | 103 | 106 |
| | (220) | 100 | 103 | 100 | 109 | 109 | 91 | 106 |
| Target material 2 | (200) | — | — | — | 98 | — | — | — |
| | (220) | — | — | — | 92 | — | — | — |

As shown in Table 1, the material of a target material 1 differs from that of a target material 2. More specifically, the target material 1 is Al-0.5% Cu having an average grain size of 72 μm and the target material 2 is Al-0.5% Cu having an average grain size of 43 μm. Table 1 shows the results obtained when a target material 20 of Al-0.5% Cu having a size of φ450 mm×t14.5 mm provided with a projecting part having a size of φ220 mm×t0.3 mm, and a backing plate material 10 of a A2024 alloy having a size of φ550 mm×t26 mm provided with a recess part having a size of φ450.3 mm×t12.0 mm at the center are diffusion-bonded together through a silver plating layer under the conditions of a pressure of 56 MPa, a bonding temperature of 270° C., a preheating time of 10 minutes, and a pressing time of 30 minutes. The silver plating treatment was applied to bonding surface side of the target material and the backing plate material, and then a zincate treatment and a coper strike plating were conducted, followed by making a silver plating layer having a thickness of about 10 μm using an electrolytic plating method. In hot pressing, a hot press machine was used, the hot press machine being a machine (model number: MSF-1000HP) manufactured by MORI IRON WORKS CO., LTD. equipped with an upper hot plate and a lower hot plate, each is made of SCM440 and has a size of 1,000 mm×1,000 mm×t100 mm. An assembled body composed of a backing plate material and a target material placed on a lower hot plate was heated while moving an upper hot plate in a vertically downward direction and pressing from above.

A change rate of the X-ray intensity ratio of each crystal orientation in the target material was obtained by the following procedure. First, a measurement sample having a size of 15 mm×15 mm×t10 mm cut out from a part of the target material before bonding was prepared and subjected to surface polishing with a waterproof abrasive paper, followed by surface etching with an aqueous cupric chloride solution so as to eliminate distortion of a surface. Aqua regia, a nitric acid fluoride solution, a sodium hydroxide solution, and the like may be used for etching of the surface. After washing with water and drying, the measurement sample was subjected to θ/2θ measurement (start angle of 20°, closure angle of 80°, sample rotation rate of 30 rpm, scanning rate of 2°, step width of 0.01°, voltage of 40 kV, current of 40 mA) using an X-ray diffraction (XRD) instrument (model type: Ultima IV) manufactured by Rigaku Corporation to determine a measurement strength (cps) of each of the crystal planes of (111), (200), (220), and (311). Each of the measured strength of (111), (200), (220), and (311) was divided by a relative strength ratio of each crystal plane to determine a correction strength, and the correction strength of each crystal plane was divided by the total value of the correction strength of (111), (200), (220), and (311), and then the strength ratios of two crystal planes (200) and (220) were calculated. Then, a measurement sample cut out partially from the target material after hot pressing was also prepared, and strength ratios of two crystal planes (200) and (220) were calculated in the same manner to determine a change rate of the X-ray intensity ratios of the two crystal orientations of (200) and (220) in the target material.

As is apparent from Table 1, the change rate of the X-ray intensity ratio of the crystal orientation in the target material before and after hot pressing is from 90% to 110%. Therefore, deterioration of the target material can be reduced before and after hot pressing. It is known that a sputtering rate during sputtering differs depending on every crystal orientation of the target material, and a change in crystal orientation causes a change in sputtering properties. The crystal orientation in the target material, in the case of metal, is generally adjusted by casting and subsequent heat treatment and plastic working. Preferably a change in crystal orientation is not generated at a stage of bonding and the change rate of the X-ray intensity ratio of the crystal orientation is suppressed to 80% to 120%, and preferably 90% to 110%.

Table 2 shows a change rate of a grain size in the target material before and after hot pressing.

As is apparent from Table 2, before and after hot pressing, the change rate of the grain size in the target material is from 80% to 125% when the temperature during hot pressing is from 240° C. to 320° C. Therefore, when the target material is Al or an Al alloy, it is possible to reduce deterioration of the target material before and after hot pressing if the temperature during hot pressing is adjusted to 240° C. to 350° C., and preferably 240° C. to 330° C.

Second Embodiment

Figure 11:
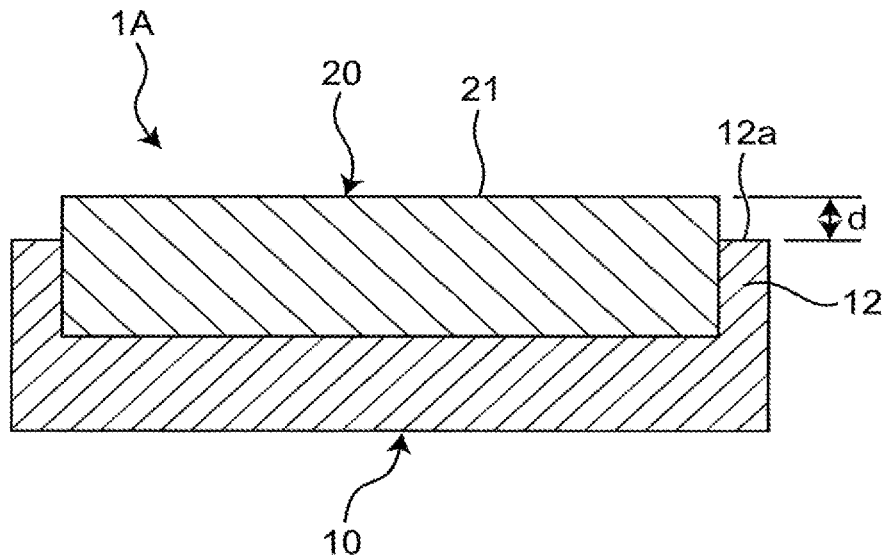
FIG. 11 It is a cross-sectional view showing a second embodiment of a sputtering target of the present invention.

FIG. 11 is a cross-sectional view showing a second embodiment of a sputtering target of the present invention. The second embodiment differs from the first embodiment in a shape of the top face in the target material. This different element will be described below.

As shown in FIG. 11, the entire surface of the top face 21 in the target material 20 is flat in a sputtering target 1A in the incorporating step. The position (uppermost position) of the top face 21 in the target material 20 is set so as to be higher than the position (uppermost position) of the top face 12a in the frame part 12 of the backing plate material 10 in the height direction of the frame part 12 of the backing plate material 10.

Accordingly, since the entire surface of the top face 21 of the target material 20 is flat, the upper hot plate 31 can be pressed against the entire surface of the top face 21 of the target material 20 during hot pressing to apply a load uniformly to the entire target material 20.

Third Embodiment

Figure 12:
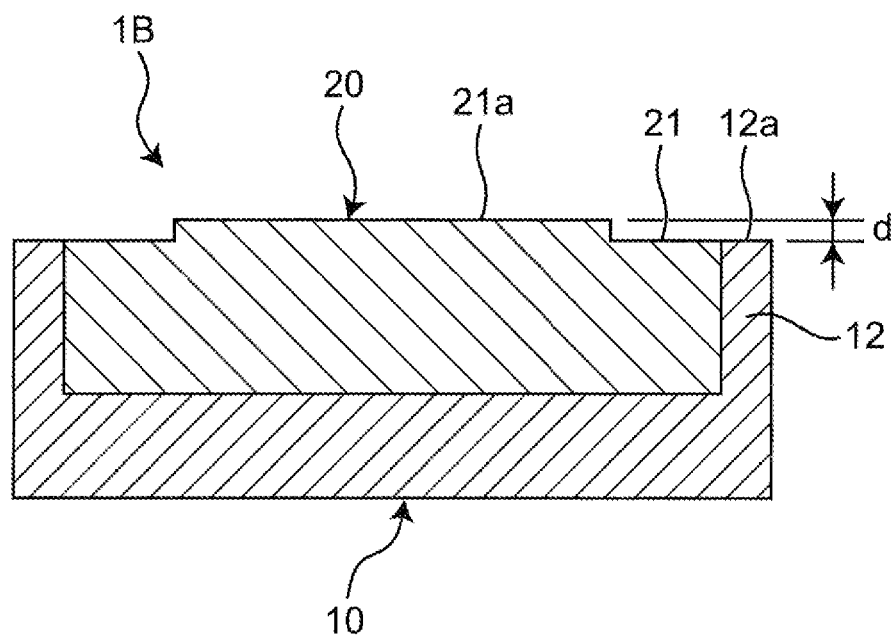
FIG. 12 It is a cross-sectional view showing a third embodiment of a sputtering target of the present invention.

FIG. 12 is a cross-sectional view showing a third embodiment of a sputtering target of the present invention. The third

TABLE 2

| | Position | Average grain size before hot pressing (μm) | Average grain size after hot pressing (μm) | | | | | | | |
|---|---|---|---|---|---|---|---|---|---|---|
| | | | 240° C. | 250° C. | 260° C. | 270° C. | 280° C. | 300° C. | 320° C. | 350° C. |
| Target material 1 | Center part | 70 | 64 | 69 | 80 | 66 | 74 | 79 | 71 | 110 |
| Target material 1 | End part | 75 | 67 | 70 | 74 | 83 | 64 | 83 | 79 | 119 |
| Target material 2 | Center part | 45 | — | — | — | 46 | — | — | — | — |
| Target material 2 | End part | 42 | — | — | — | 41 | — | — | — | — |

| | Change ratio before and after hot pressing (%) | | | | | | | |
|---|---|---|---|---|---|---|---|---|
| | 240° C. | 250° C. | 260° C. | 270° C. | 280° C. | 300° C. | 320° C. | 350° C. |
| Target material 1 | 91 | 99 | 114 | 94 | 106 | 113 | 101 | 157 |
| Target material 1 | 89 | 93 | 99 | 111 | 85 | 111 | 105 | 159 |
| Target material 2 | — | — | — | 102 | — | — | — | — |
| Target material 2 | — | — | — | 98 | — | — | — | — |

As shown in Table 2, the target material 1 and the target material 2 are used. The conditions during hot pressing are equivalent to bonding conditions of the target material 1 and the target material 2. The grain size means an average grain size, which was calculated by a cutting method of JIS H 0501 after sampling a test piece having a size of 15 mm×15 mm×t10 mm from the vicinity of the surface layers of the center part and the end part in the target material. Then, values before and after hot pressing were determined to calculate the change rate of the grain sizes of the target material.

embodiment differs from the first embodiment in a positional relationship between the backing plate material and the target material. The difference in element will be described below.

As shown in FIG. 12, in a sputtering target 1B in the incorporating step, the position (uppermost position) of the projecting part 21a of the top face 21 in the target material 20 is set to be higher than the position (uppermost position) of the top face 12a of the frame part 12 in the backing plate material 10 in the height direction of the frame part 12 of the backing plate material 10. The position of a part (part except for the projecting part 21a) of the top face 21 of the target material 20 is identical to the position of the top face 12a of the frame part 12 of the backing plate material 10.

Therefore, the part of the top face 21 of the target material 20 has a height identical to the uppermost position of the frame part 12 of the backing plate material 10, so that the upper hot plate 31 can be pressed only to the projecting part 21a of the top face 21 of the target material 20 during hot pressing, to thereby reduce amount of the target material 20 crushed by pressing the upper hot plate 31. Therefore, a waste amount of the target material 20 can be reduced due to crushing.

The present invention is not limited to the above embodiments, but design can be changed without departing from the spirit and scope of the present invention. For example, features of the first to third embodiments may be used in combination in various ways.

In the embodiments, the backing plate material and the target material are bonded together by hot pressing, but the backing plate material and the target material may be bonded together by the hot isotropic pressing method.

In the embodiment, the backing plate material has a frame part in the manufactured sputtering target, and the frame part may be at least partially cut out in the finishing step. The sputtering face may be made flat and smooth by cutting and polishing at least a part of the top face (including the projecting part) of the target material in the finishing step.

DESCRIPTION OF REFERENCE NUMERALS 1, 1A, 1B Sputtering target
10 Backing plate material
11 Base plate
11a Top face
12 Frame part
12a Top face
20 Target material
20a Bottom face
21 Top face
21a Projecting part
31 Upper hot plate
32 Lower hot plate
40 Plating layer
d Height difference between uppermost position of target material and uppermost position of frame part of backing plate material
T1 Thickness of target material before pressing
T2 Thickness of target material after pressing

The invention claimed is:

1. A process for producing a sputtering target in which a target material is diffusion-bonded to a backing plate material having an annular frame part, the method comprising:
an incorporating step of incorporating the target material inside the frame part of the backing plate material in such a manner that the uppermost position of the target material becomes higher than the uppermost position of the frame part of the backing plate material in a height direction of the frame part of the backing plate material; and
a bonding step of diffusion-bonding the target material to the backing plate material,
said target material having a hardness smaller than the backing plate material.

2. The process for producing a sputtering target according to claim 1, wherein, in the bonding step, the target material is diffusion-bonded to the backing plate material by heating while pressing the target material in a uniaxial direction using a hot plate.

3. The process for producing a sputtering target according to claim 1, wherein, in the incorporating step, a height difference between the uppermost position of the target material and the uppermost position of the frame part of the backing plate material is adjusted to 1% or more relative to a thickness of the target material.

4. The process for producing a sputtering target according to claim 1, wherein the material of the target material is Al or an Al alloy.

5. The process for producing a sputtering target according to claim 1, wherein the material of the backing plate material is a material selected from one or more of Al, Cu, Ti, Mo, W, Ta, Nb, Fe, and alloys thereof.

6. The process for producing a sputtering target according to claim 1, wherein, before the incorporating step, a plating layer is provided on at least one of the backing plate material and the target material, and the backing plate material and the target material are bonded together through the plating layer in the bonding step.

7. The process for producing a sputtering target according to claim 1, wherein, before and after the bonding step, a change rate of an X-ray intensity ratio in crystal orientation of the target material is from 80% to 120%.

8. The process for producing a sputtering target according to claim 1, wherein, before and after the bonding step, a change rate of a grain size in the target material is from 75% to 125%.

9. A process for producing a sputtering target in which a target material is diffusion-bonded to a backing plate material having an annular frame part, the method comprising:
an incorporating step of incorporating the target material inside the frame part of the backing plate material in such a manner that the uppermost position of the target material becomes higher than the uppermost position of the frame part of the backing plate material in a height direction of the frame part of the backing plate material; and
a bonding step of diffusion-bonding the target material to the backing plate material,
wherein, before and after the bonding step, a change rate of an X- ray intensity ratio in crystal orientation of the target material is from 80% to 120%.

10. A process for producing a sputtering target in which a target material is diffusion-bonded to a backing plate material having an annular frame part, the method comprising:
an incorporating step of incorporating the target material inside the frame part of the backing plate material in such a manner that the uppermost position of the target material becomes higher than the uppermost position of the frame part of the backing plate material in a height direction of the frame part of the backing plate material; and
a bonding step of diffusion-bonding the target material to the backing plate material,
wherein, before and after the bonding step, a change rate of a grain size in the target material is from 75% to 125%.

* * * * *